US006488776B2

(12) United States Patent
Wang

(10) Patent No.: US 6,488,776 B2
(45) Date of Patent: Dec. 3, 2002

(54) METHOD AND APPARATUS FOR FORMING INSITU BORON DOPED POLYCRYSTALLINE AND AMORPHOUS SILICON FILMS

(75) Inventor: Shulin Wang, Campbell, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/145,469

(22) Filed: May 13, 2002

(65) Prior Publication Data

US 2002/0162505 A1 Nov. 7, 2002

Related U.S. Application Data

(62) Division of application No. 09/163,594, filed on Sep. 29, 1998, now Pat. No. 6,410,090.

(51) Int. Cl.$^7$ .................. H01L 21/205; H01L 21/20; C23C 16/00
(52) U.S. Cl. .................. 118/715; 118/724; 118/725; 118/728; 118/663; 427/248.1; 156/345.15; 156/345.23; 156/345.24; 156/345.26; 156/345.51; 156/345.52
(58) Field of Search .................. 118/715; 427/248.1; 438/680, 684

(56) References Cited

U.S. PATENT DOCUMENTS

| 4,696,702 A | 9/1987 | Ellis, Jr. et al. |
| 5,672,204 A | 9/1997 | Habuka |
| 5,863,598 A | 1/1999 | Venkatesan et al. |

FOREIGN PATENT DOCUMENTS

| EP | 0801148 A1 | 10/1997 |
| EP | 0823491 A2 | 2/1998 |
| EP | 0823491 A3 | 1/1999 |
| JP | 62229826 | 10/1987 |

OTHER PUBLICATIONS

S. Nakamura et al. "The Uniformity Control on Silicon Epitaxial Growth Using a Laminar Flow" Extended Abstracts, US Electrochemical Society, Princeton, NJ, vol. 92/2, pp. 622–623, X000549968.
F.C. Eversteyn "Chemical–Reaction Engineering in the Semiconductor Industry", Philips Research Reports, Feb. 1974, Netherlands, vol. 29, No. 1, pp. 45–46, XP002127010.
International Search Report PCT/US 99/22627.

*Primary Examiner*—Gregory Mills
*Assistant Examiner*—Ram Kacker
(74) *Attorney, Agent, or Firm*—Blakely Sokoloff Taylor & Zafman

(57) ABSTRACT

A method and apparatus for depositing a boron insitu doped amorphous or polycrystalline silicon film on a substrate. According to the present invention, a substrate is placed into deposition chamber. A reactant gas mix comprising a silicon source gas, boron source gas, and a carrier gas is fed into the deposition chamber. The carrier gas is fed into the deposition chamber at a rate so that the residence of the carrier gas in the deposition chamber is less then or equal to 3 seconds or alternatively has a velocity of at least 4 inches/sec.

In another embodiment of forming a boron doped amorphous for polycrystalline silicon film a substrate is placed into a deposition chamber. The substrate is heated to a deposition temperature between 580–750° C. and the chamber pressure reduced to a deposition pressure of less than or equal to 50 torr. A silicon source gas is fed into the deposition at a rate to provide a silicon source gas partial pressure of between 1–5 torr. Additionally, a boron source gas is fed into the deposition chamber at a rate to provide a boron gas partial pressure of between 0.005–0.05 torr.

3 Claims, 6 Drawing Sheets

METHOD AND APPARATUS FOR FORMING INSITU BORON DOPED POLYCRYSTALLINE AND AMORPHOUS SILICON FILMS

This is a Divisional Application of Ser. No. 09/163,594 filed Sep. 29, 1998, now U.S. Pat. No. 6,410,090.

BACKGROUND OF THE INVENTION

1. Field of the Invention

The present invention relates to the field of thin film formation, and more particularly to a method and apparatus for depositing an insitu boron doped amorphous or polycrystalline silicon film.

2. Discussion of Related Art

Polycrystalline silicon (polysilicon) and amorphous silicon thin films are used throughout the many semiconductor integrated circuit manufacturing processes. These films are used, for example, in the fabrication of gate electrodes, stack or trench capacitors, emitters, contacts, fuses, and antifuses. As device dimensions decrease to below 0.25 microns in order to increase packing density, aspect ratios (aspect ratio=depth/width) of holes, vias, and trenches in the integrated circuit are also increasing. In order to fill high aspect ratio openings (aspect ratios $\geq$ to 2.5), deposition processes which are capable of good step coverage (step coverage %=film thickness on a step surface/film thickness on a flat surface×100%) are required to ensure complete hole filling without the creation of voids.

One current method which can provide adequate step coverage is low pressure chemical vapor deposition (LPCVD). In LPCVD processes, reaction vessels are evacuated to relatively low pressures of between 100–1000 m torr. The low pressures associated with LPCVD processes cause silicon films to be deposited at low rates (about 100 angstroms (Å)/minute for undoped films and about 20 Å/minute for doped films). The low deposition rates enable the films to be deposited with good step coverage. When n-type dopants are introduced in a LPCVD batch system to produce an insitu doped film, step coverage decreases. A further reduction in the deposition rate is necessary for good step coverage. Although LPCVD processes can form high quality films, their low deposition rates necessitate the processing of multiple wafers (i.e. up to 100) at one time in a batch type reaction vessel. A problem with processing a plurality of wafers in a single machine at a single time is that it is difficult to obtain uniform thickness film and dopant concentration from wafer to wafer and from batch to batch.

To fabricate polysilicon and amorphous silicon films with precise thickness and doping uniformity across a wafer and from wafer to wafer, single wafer CVD processes are used. A single wafer CVD process for producing a silicon layer on a silicon wafer is described in U.S. Ser. No. 07/742,954, filed Aug. 9, 1991, entitled Low Temperature High Pressure Silicon Deposition Method and is assigned to the present assignee. Such a single wafer reactor can reliably form a uniform silicon film which is insitu doped with n type dopants (e.g. arsenic and phosphorus).

At times, however, such as in the manufacture of Flash memory devices and p channel devices, it is desireable to form amorphous or polycrystalline films which are insitu doped with p type dopants (e.g. boron).

Thus, what is desired is a method and apparatus which enables an insitu boron doped polycrystalline or amorphous silicon film to be deposited in a single wafer reactor without forming deposits on the chamber windows and liners.

SUMMARY OF THE INVENTION

A method and apparatus for depositing an insitu boron doped amorphous or polycrystalline silicon film on a substrate. According to the present invention, a substrate is placed into a deposition chamber. A reactant gas mix comprising a silicon source gas, a boron source gas, and a carrier gas are fed into the deposition chamber. The reactant gas mix is fed into the deposition chamber at a rate so that the residence time of the reactant gas in the deposition chamber is less then or equal to 3 seconds or alternatively has a velocity of at least 4 inches/sec.

In another embodiment of the present invention an insitu boron doped amorphous and polycrystalline silicon film, a substrate is placed into a deposition chamber. The substrate is then heated to a deposition temperature between 580–750° C. and the chamber pressure reduced to less than or equal to 50 torr. A silicon source gas is then fed into the deposition at a rate to provide a silicon source gas partial pressure of between 1–5 torr while a boron source gas is fed into the deposition chamber at a rate to provide a boron source gas partial pressure of between 0.005–0.05 torr.

DETAILED DESCRIPTION OF THE PRESENT INVENTION

The present invention describes a novel method and apparatus for depositing an insitu boron doped polycrystalline or amorphous silicon film. In the following description, numerous specific details are set forth such as specific process parameters and implementation in order to provide a thorough understanding of the present invention. It will be obvious, however, to one skilled in the art, that the present invention may be practiced without the specific details. In other instances, well known chemical vapor deposition (CVD) equipment and semiconductor methodology have not been described in particular detail in order to not necessarily obscure the present invention.

The present invention describes a method and apparatus for depositing an insitu boron doped polycrystalline or amorphous silicon film at a high deposition rate and with good step coverage. According to the present invention, a substrate (or wafer) is placed into a deposition chamber of a thermal chemical vapor deposition (CVD) apparatus. The pressure in the deposition chamber is then reduced to a deposition pressure of less than or equal to 50 torrs and the substrate heated to a deposition temperature of greater than or equal to 580° C. A reactant gas mix comprising a silicon containing gas, such as but not limited to silane ($SiH_4$), a boron containing gas, such as but not limited to diborane, ($B_2H_6$) and a carrier gas, such as but not limited to hydrogen ($H_2$) and helium (He) is fed into the deposition chamber. Heat from the substrate causes the silicon containing gas to disassociate and provide silicon atoms and causes the diborane to disassociate and provide boron atoms. A polycrystalline or amorphous silicon film doped insitu with boron atoms is then deposited on to the substrate from the silicon atoms and the boron atoms.

The present invention uses a combination of low deposition pressure (less than 50 torr) and high carrier gas flow (greater than 10 SLM) to form the insitu boron doped amorphous or polycrystalline silicon film of the present invention. The combination of low deposition pressure and high carrier gas flow enables the formation of a silicon film with a high boron concentration of (up to $4 \times 10^{20}$ atoms/$cm^3$) at a high deposition rate (greater than 1000 Å/min). Additionally, the combination of low deposition pressure and high carrier gas flow dramatically reduces film formation on the domes (windows) and on the sidewall liner of the CVD apparatus. By preventing film formation on the domes, film uniformity from wafer to wafer is dramatically improved. Additionally, by reducing film formation on the windows and liners, more wafers can be processed before cleaning is required thereby reducing the cost of the deposition process.

Figure 1A:
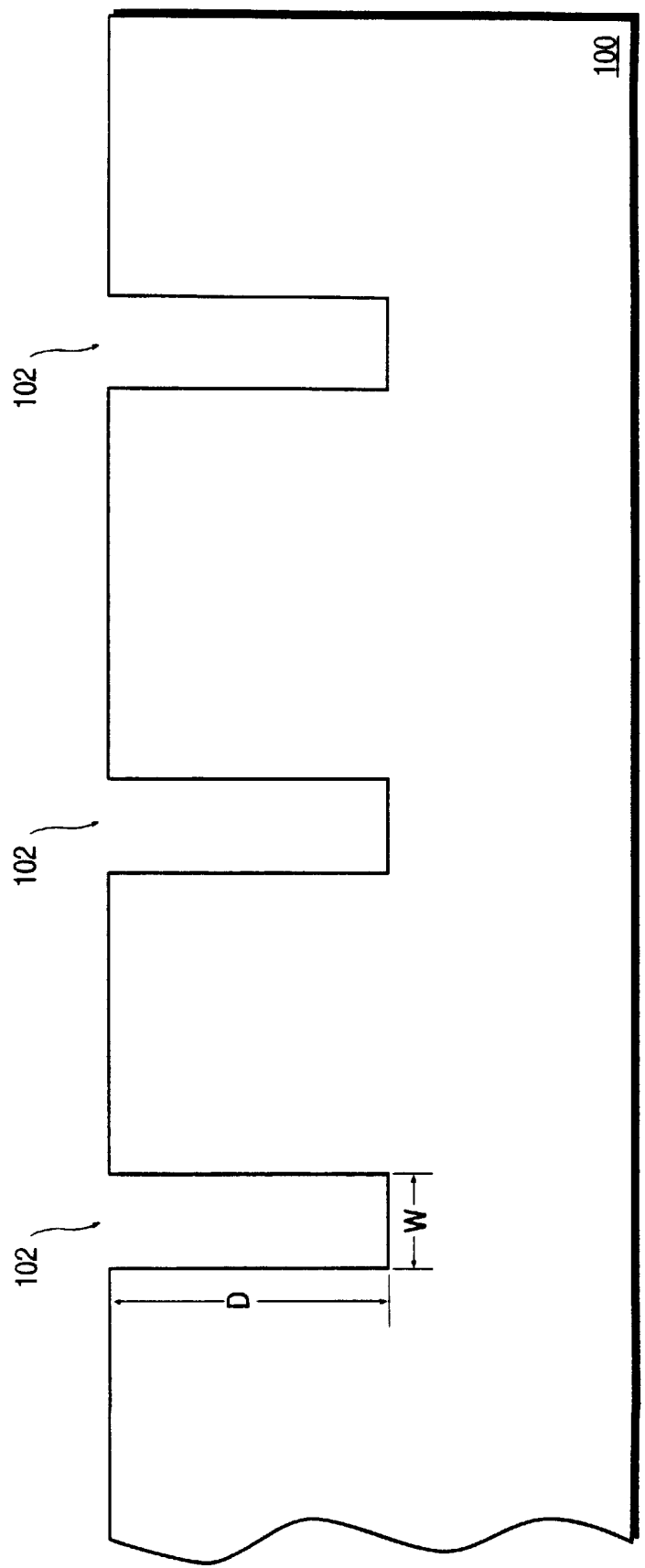
FIG. 1A is an illustration of a cross sectional view of a substrate on which the insitu boron doped silicon film of the present invention can be formed.

The insitu boron doped amorphous or polycrystalline silicon film of the present invention can be formed on a substrate, such as semiconductor substrate 100, shown in FIG. 1A. Substrate 100 is preferably a monocrystalline silicon wafer. Substrate 100, however, need not necessarily be a silicon wafer, and may be other types of substrates such as a gallium arsenide or a germanium silicon substrate or substrates used for other purposes. Substrate 100 typically will include a plurality of spaced apart features or holes 102. Features 102 can be due to, but not limited to, trenches formed in a substrate, field oxide regions formed on a substrate, and contact/via openings formed in an interlayer dielectric (ILD). The process of the present invention is ideally suited for depositing a high concentration (>$5 \times 10^{19}$ atoms/$cm^3$) boron doped silicon film into a high aspect ratio opening (greater than 2:1) during the formation of capacitors and/or contacts in the manufacturer of modern high density dynamic random access memories (DRAM) and other integrated circuits. Although the present invention is ideally suited for use in manufacturer of integrated circuits, the present invention is equally applicable to the formation of other products. For the purposes of the present invention, substrate 100 is defined as a material onto which the insitu boron doped amorphous or polycrystalline silicon film of the present invention film is deposited.

The method of the present invention will be described and illustrated with respect to the flowchart 200 of FIG. 2. The first step of the present invention as set forth in block 202 of flowchart 200 is to place a substrate, such as substrate 100, into a deposition chamber of a thermal chemical vapor deposition apparatus, such as a single substrate reactor 300 shown in FIG. 3A. The single substrate reactor 300 shown in FIG. 3A has a top quartz window (or dome) 312, sidewalls 314 and a bottom quartz window (or dome) 318 that define a chamber 319 into which a single wafer or substrate 100 can be located. The interior of sidewalls 314 are covered by a quartz liner. Chamber 319 is designed to handle wafers up to 200 mm and has a volume of approximately 10 liters. An example of such a reactor is the Applied Materials Centura Single Wafer Chamber Tool. It is to be appreciated that larger volume chambers for handling larger wafers such as 300 mm, may be used if desired. Additionally, all flow rates provided herein are with respect to a 10 liter chamber and one skilled in the art will recognize the ability to scale flow rates for different volume chambers if desired. What is important is to utilize the partial pressures of the gases provided herein.

Substrate 100 is mounted on a pedestal or susceptor 322 that is rotated by a motor (not shown) to provide a time average environment for substrate 100 that is cylindrically symmetric. A susceptor circumscribing preheat ring 324 supported by sidewall 314 and surrounds susceptor 322 and substrate 100. Lifting fingers 323 pass through holes (not shown) formed through susceptor 322 to engage the underside of substrate 100 to lift it off susceptor 322. Substrate 100, preheat ring 324, and susceptor 322 are heated by light from a plurality of high intensity lamps 326 mounted outside of reactor 300. High intensity lamps 326 are preferably tungsten halogen lamps which produce infrared (IR) light at a wavelength of approximately 1.1 microns. The top 312 and bottom 318 of reactor 310 are substantially transparent to light to enable light from external lamps 326 to enter reactor 310 and heat susceptor 322, substrate 100 and preheat ring 324. Quartz is preferably used for the top 312 and bottom 318 because it is transparent to light of a visible and IR frequency; because it is relatively high strength material that can support a large pressure difference across; and because it has a low rate of outgassing. A suitable top temperature sensor 340 and a suitable bottom temperature sensor 342 such as pyrometers are positioned to measure the temperature of substrate 100 and a temperature of susceptor 322, respectively. Although a lamp heated chamber is desired, the present invention can be carried out in other types of thermal CVD chambers such as resistance heated chambers. Additionally, although reactor 300 typically includes a single wafer it is possible to size susceptor 322 sufficiently to position multiple wafers face up on susceptor 322. Apparatus 300 includes a system controller 350 which controls various operations, of apparatus 300 such as controlling gas flows, substrate temperature, and chamber pressure.

Figure 2:
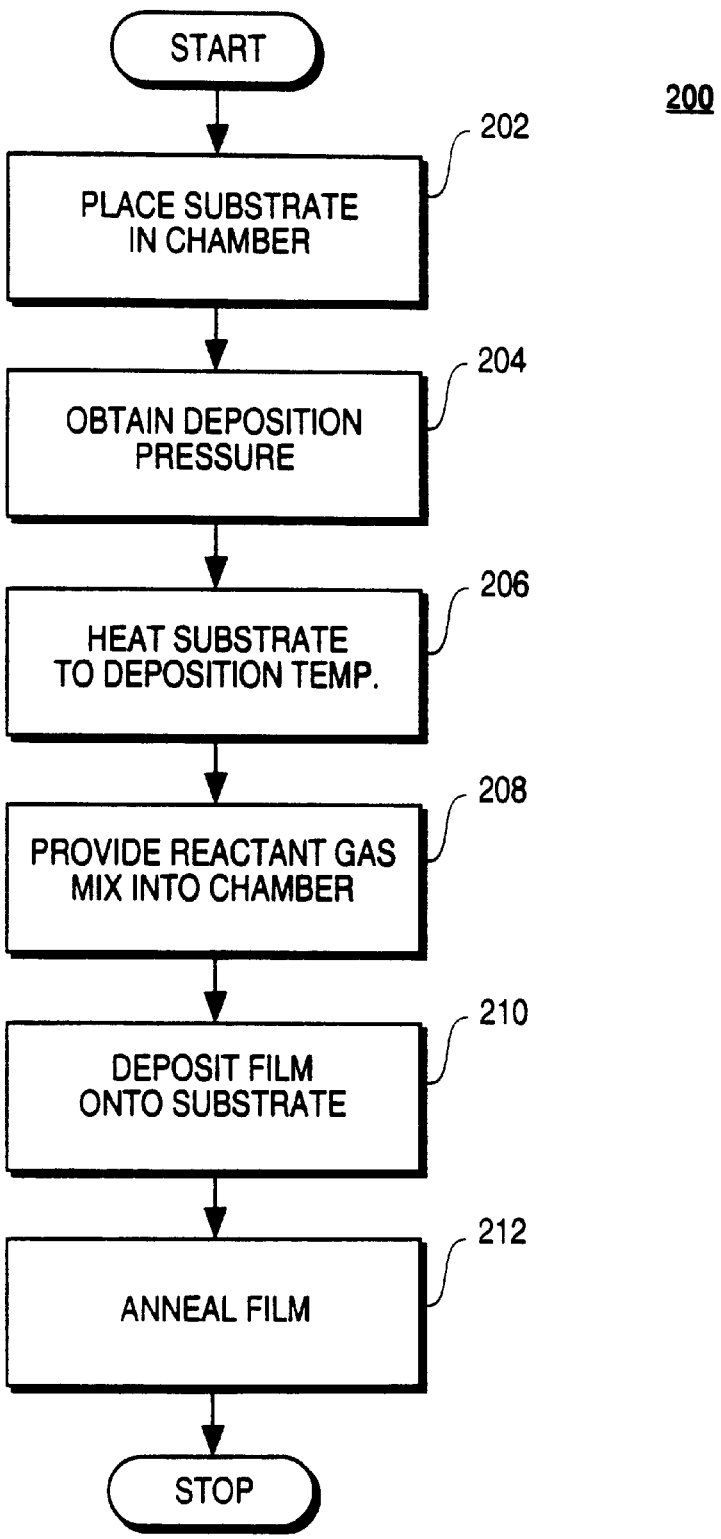
FIG. 2 is a flowchart which illustrates a method of forming an insitu boron doped amorphous or polycrystalline silicon film in accordance with the present invention.
Figure 3A:
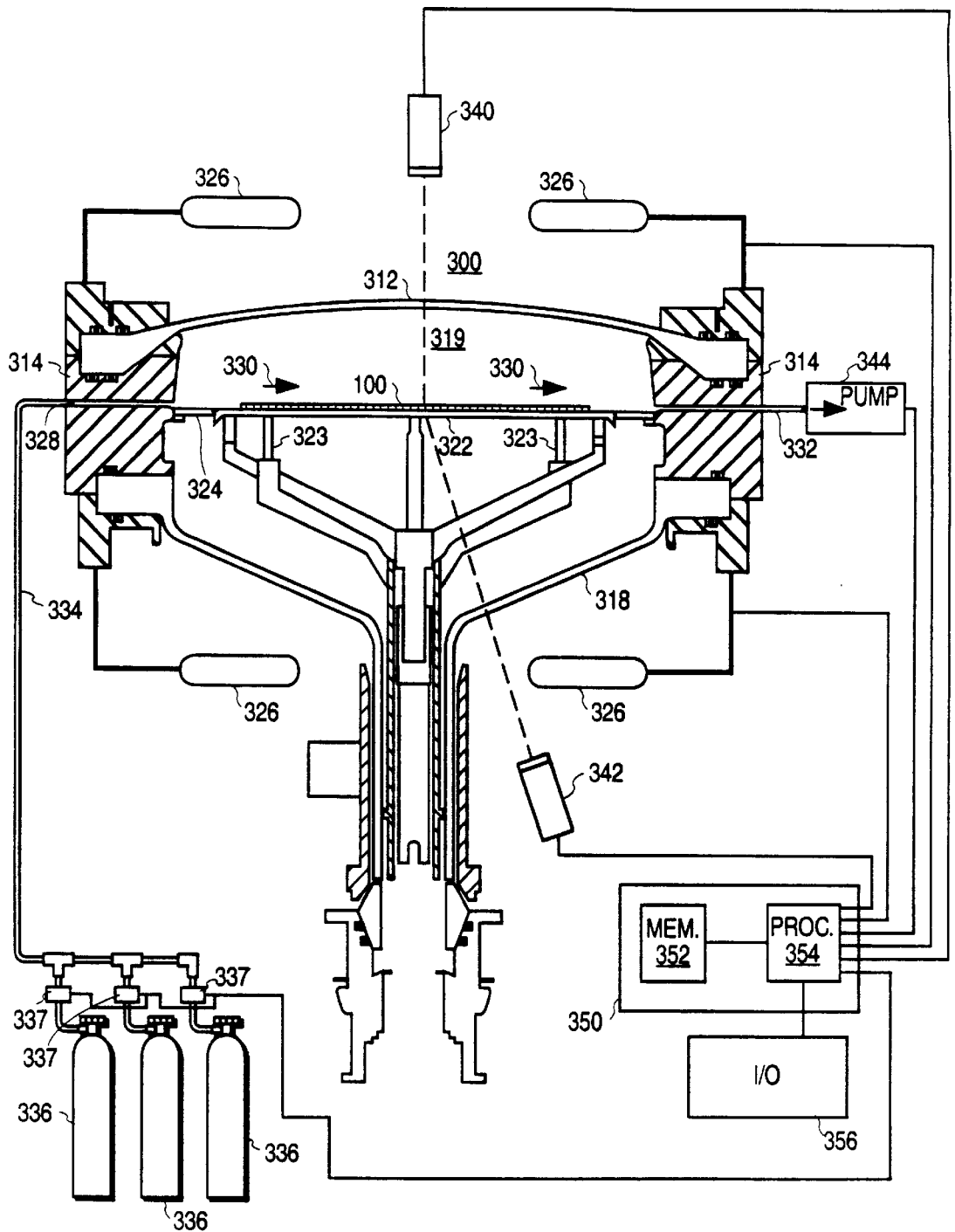
FIG. 3A is an illustration of a single wafer thermal chemical vapor deposition apparatus which can be used to deposit the insitu boron doped amorphous or polycrystalline silicon film of the present invention.

Next, according to block 204 of FIG. 2, chamber 319 is evacuated through exhaust port 332 by a pump 344 to reduce the pressure in chamber 319 from atmospheric pressure to deposition pressure. The deposition pressure is the total pressure within chamber 319 when a insitu boron doped amorphous or polycrystalline silicon film of the present invention is deposited. The deposition pressure of the present invention is between 10–50 torr. The low deposition pressure helps prevent dome coating and provide good step coverage.

Next, as set forth in block 206, of flowchart 200 substrate 100, preheat ring 324 and susceptor 322 are heated by lamps 326 to the deposition temperature. The deposition temperature of the present invention is at least 580° C. and preferably between 600–750° C. It is to be appreciated that the exact crystalline structure of the deposited silicon film depends upon the deposition temperature. In order to deposit an amorphous silicon film which is insitu doped with boron atoms the deposition temperature should be between 580–620° C. In order to deposit a polycrystalline silicon film which is insitu doped with boron atoms the deposition temperature should be greater than 620° C.

Figure 1B:
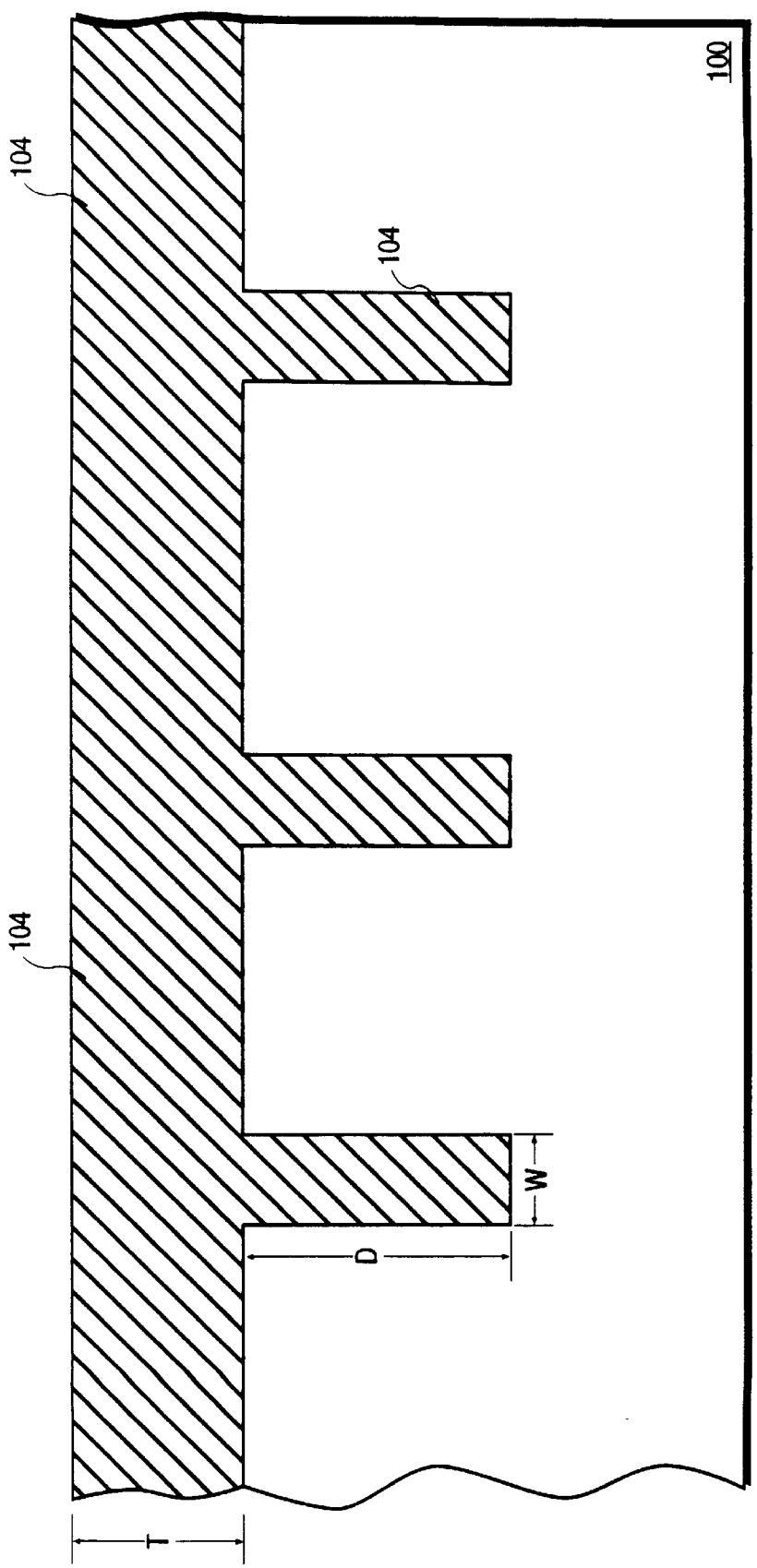
FIG. 1B is an illustration of a cross-sectional view showing the formation of a insitu boron doped silicon film on the substrate of FIG. 1A.

Next, as set forth in block 208 of flowchart 200, a reactant gas mix is fed into reaction chamber 319. According to the present invention the reactant gas mix comprises a silicon containing gas, such as but not limited to silane ($SiH_4$) and disiline ($Si_2H_6$), a boron source, such as but not limited to diborane ($B_2H_6$), and a carrier gas such as but not limited to hydrogen ($H_2$), Helium (He), and nitrogen ($N_2$). The deposition pressure and temperature are maintained within the specified ranges while the reactant gas mix flows into reaction chamber 319 to deposit and insitu boron doped amorphous or polycrystalline silicon film 104 on substrate 100 as shown in FIG. 1B and set forth in block 210 of flowchart 200.

During deposition, the reactant gas mix stream flows from gas input 328 across preheat ring 324 where the gases are heated, across substrate 100 in the direction of arrows 330 to deposit and insitu boron doped amorphous or polycrystalline silicon film 104 thereon and out through exhaust port 332. The gas input port 328 is connected, via conduit 334 to a gas supply represented by tanks 336 that provides one or a mixture of gases. The gas concentration and/or flow rate through conduit 334 and each of the ports 328 and 332 are selected to produce processing gas flows and concentration profiles that optimize processing uniformity. Although the rotation of the substrate 100 in the thermal gradients caused by heat lamp 326 can significantly affect the flow of gases in reactor 300 the dominant shape of flow profile is laminar flow from gas input port 328 across preheat ring 324 and substrate 100 to exhaust port 332.

According to an embodiment of the present invention, the silicon containing gas is provided into the deposition chamber 319 at a flow rate between 200–1000 SCCM to produce a silicon containing gas partial pressure of between 1–5 torr and preferably between 1.5–2.5 torr. Diborane ($B_2H_6$) is fed into the deposition chamber of between 0.5–2.0 SCCM to produce a diborane partial pressure of between 0.005–0.05 torr. Diborane is preferably diluted with a carrier gas, such as $H_2$, to form a 1% diluted diborane dopant gas (i.e. diluted diborane equals 1% diborane and 99% carrier gas) in order to enable better control of the amount of diborane which is provided into reaction chamber 319. As such, when a 1% diluted diborane dopant gas is utilized it is fed into the chamber at a rate of between 50–200 SCCM in order to produce a diborane partial pressure of between 0.005–0.05 torr. The amount of diborane provided into chamber 319 during the deposition is less than 1% of the amount of silicon containing gas provided into the chamber during deposition. The silicon containing gas and the diluted diborane are combined with a carrier gas, such as H2, outside of reaction chamber 319 to form the reactant gas mix. The carrier gas transports the silicon containing gas and the diluted diborane dopant gas into chamber 319.

Figure 4:
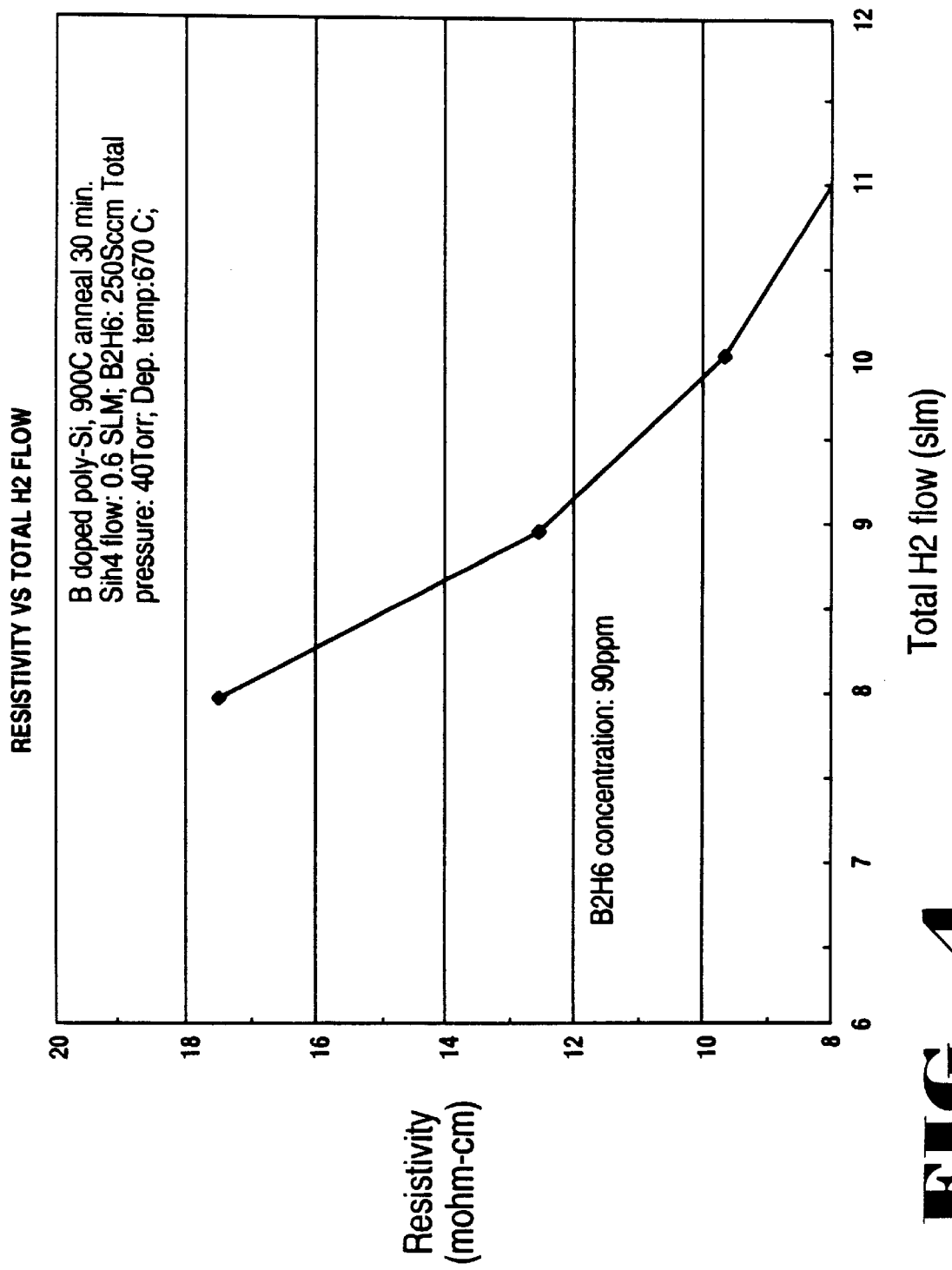
FIG. 4 is a graph which illustrates how the resitivity of an insitu boron doped polycrystalline film decreases with increasing carrier gas flow.

According to present invention a large carrier gas flow rate of at least 10 SLM and preferably between 10–15 SLM is used, such a large carrier gas flow rate produces a carrier gas partial pressure of between 9–48 torr. It has been found that increasing the carrier gas flow increases the amount of boron which is incorporated into the deposited amorphous or polycrystalline silicon film for a fixed boron flow. By utilizing a high carrier gas flow a relatively small amount of diborane is needed in the ambient to achieve a relatively high boron concentration (at least $5\times10^{19}$ atoms/cm$^3$ and up to $4\times10^{20}$ atoms/cm$^3$) into the deposited film. FIG. 4 is a graph which illustrates how under constant conditions the resistivity of a polycrystalline silicon film insitu doped with boron atoms decreases with increasing carrier gas flow. It has been found that diborane assists in the decomposition of the silicon source gas into silicon atoms. Increasing the disassociation of the silicon source gas leads to an increase in silicon deposition and an increase of silicon deposition on the walls of the chamber 319 and on the quartz windows 312 and 318. By reducing the amount of diborane in the chamber during deposition, film deposition on the sidewalls and on the quartz windows is dramatically reduced.

Another benefit of the high carrier gas flow used in the present invention is that the boundary layer of the laminar flow of the reactant gas mix is decreased. By lowering the boundary layer of the reactant gas mix, the chance of film deposition on the top and bottom quartz windows 312 and 318 is dramatically reduced.

Additionally, the use of a low deposition pressure during the formation of an insitu boron doped amorphous or silicon film helps to reduce dome coating. Although the present invention uses a low deposition pressure, a silicon film having a boron doping density of up to $4\times10^{20}$/atoms/cm$^3$ can still be formed at a relatively high deposition rate of greater than 1000 Å/min. The high deposition rate is due to the fact that diborane assists in the disassociation of the silicon source gas into silicon atoms. Additionally, the low deposition pressure enables the formation of an insitu boron doped amorphous or polycrystalline silicon film with good step coverage which in turn allows the film to fill in high aspect ratio openings of greater than 2:1 without forming voids therein.

It has been found that what is important in order to achieve an insitu boron doped silicon film having a high boron concentration without excessive film deposition on chamber windows and sidewalls, is to utilize process conditions so that the residence time of the reactant gas mix through the chamber is low, less than or equal 3.0 seconds and preferably less than 2 seconds. That is, an embodiment of the present invention the flow rate of the reactant gas mix, the pump speed, and the deposition pressure within the chamber are controlled or chosen so that the amount of time it takes for the reactant gas mix flow from the interior sidewall near gas inlet 328 to the interior sidewall near gas outlet 322 is less than or equal to 3 seconds and preferably less than 2 seconds.

The residence time ($t_{res}$) of the reactant gas mix inside chamber 319 is:

$$t_{res} = \frac{V_{ch}}{Q} \qquad \text{eq. (1)}$$

where Vch=chamber volume (liters) and where Q is the gas flow rate out of the chamber (i.e., pumping speed (liters/sec)). The ideal gas equation states:

$$\frac{PV}{T} = \frac{P_{STD} \cdot V_{STD}}{T_{STD}} \qquad \text{eq. (2)}$$

where $T_{STD}$=273°K., $P_{STD}$=760 Torr. Transforming equation (2) to flow rates yields:

$$\frac{P_{STD}Q_{STD}}{T_{STD}} = \frac{PQ}{T} \qquad \text{eq. (3)}$$

where $Q_{STD}$ is the reactant gas flow rate into the chamber, and Q is the gas flow rate out from the chamber (pumping speed (liter/sec)) and T is the deposition temperature (K°) and P is the deposition pressure (Torr). Equation (3) can be solved for Q and substituted into eq (1) to yield:

$$t_{res} = \frac{V_{ch} \cdot T_{STD} P}{T \cdot P_{STD} Q_{STD}} \qquad \text{eq. (4)}$$

It is to be appreciated that all gas molecules do the turbulence caused by the walls and domes etc. will not exhibit the same residence time in the chamber. However, equation 4 does provide a sufficiently accurate means for determining the typical residence time of gas within the chamber. As such, in an embodiment of the present invention the reactant gas has a residence time of less than or equal to 3 seconds and preferably less than or equal to 2 seconds as calculated by equation 4.

Alternative to the residence time of the reacting gas, one can look at the velocity of the reactant gas as it flows from the gas input to the gas output of the chamber. For example, in the case when reactor 300 is configured to process a 200 mm wafer (8 inch) the total distance from the interior of sidewall 314 of gas inlet 328 to the interior of sidewall 314 at gas outlet 332 is approximately 12 inches. Assuming the required residence time of less than 3 seconds and preferably less than 2 seconds yields necessary reactant gas velocity of at least 4 inches/sec. and preferably at least 6 inches/sec.

Hydrogen ($H_2$) is preferred as the carrier gas and as the dilution gas in the present invention because an ambient comprising a large amount of $H_2$ can withstand a large thermal gradient. In this way, the temperature of quartz windows 312 and 318 and sidewall 314 can be maintained at a temperature significantly lower then the temperature of substrate 100 during film deposition. By keeping the temperature of windows 312 and 318 and sidewall 314 low, film deposition or coating on the windows and sidewall is substantially reduced. Additionally by reducing film deposition on sidewalls 314 and windows 312 and 318 more wafers can be processed before cleaning is required.

Next as shown in block 212, substrate 100 can be annealed if desired. Substrate 100 can be annealed in order to convert an as deposited insitu boron doped amorphous silicon or amorphous/polycrystalline silicon film into a low resistance insitu doped polycrystalline silicon film. In this way, an amorphous silicon film can be deposited at a relatively low temperature in order to improve step coverage of the film and ensure complete hole filling and subsequently be converted by annealing into a low resistance polycrystalline silicon germanium film. Any well known method and equipment can be utilized to anneal substrate 100. For example, substrate 100 can be annealed in a furnace at a temperature greater than or equal to 800° C. for 30 minutes in a nitrogen/oxygen ambient. Alternatively, a rapid thermal anneal (RTA) at temperature about 1000° C. for less than 15 seconds in a nitrogen/oxygen ambient can be used. Although annealing substrate 100 requires an additional step many integrated circuit manufacturing processes, such as DRAM processes, require subsequent anneals for other purposes such as silicide formation and so the anneal step can be included without affecting throughput. Utilizing the anneal step of the present invention allows a low resistance insitu boron doped polycrystalline silicon film to be formed in high aspect ratio openings without void formation.

The process of the present invention can form a high quality insitu boron doped polycrystalline or amorphous silicon film with a high dopant density ($5 \times 10^{19} - 4 \times 10^{20}$ atoms/cm$^3$) and therefore a low resistivity (as low as 1.0 mohm-cm) at a high deposition rate (between 600 Å/min–1, 200 Å/min) and with excellent step coverage (above 90%). The present invention can be reliably used to fill openings in a substrate 100 having a width less than 0.28 microns and an aspect ratio greater than 2.0 at a high deposition rate without creating voids therein.

In a embodiment of the present invention the system controller 350 includes a hard disk drive (memory 352), a floppy disk drive and a processor 354. The processor contains a single board computer (SBC), analog and digital input/output boards, interface boards and stepper motor controller board. Various parts of CVD system 300 conform to the Versa Modular Europeans (VME) standard which defines board, card cage, and connector dimensions and types. The VME standard also defines the bus structure having a 16-bit data bus and 24bit address bus.

System controller 350 controls all of the activities of the CVD machine. The system controller executes system control software, which is a computer program stored in a computer-readable medium such as a memory 352. Preferably, memory 352 is a hard disk drive, but memory 352 may also be other kinds of memory. The computer program includes sets of instructions that dictate the timing, mixture of gases, chamber pressure, chamber temperature, lamp power levels, susceptor position, and other parameters of a particular process. Of course, other computer programs such as one stored on another memory device including, for example, a floppy disk or other another appropriate drive, may also be used to operate controller 350. An input/output device 356 such as a CRT monitor and a keyboard is used to interface between a user and controller 350.

The process for depositing the film can be implemented using a computer program product which is stored in memory 352 and is executed by controller 350. The computer program code can be written in any conventional computer readable programming language, such as, 68000 assembly language, C, C++, Pascal, Fortran, or others. Suitable program code is entered into a single file, or multiple files, using a conventional text editor, and stored or embodied in a computer usable medium, such as a memory system of the computer. If the entered code text is in a high level language, the code is compiled, and the resultant complier code is then linked with an object code of precompiled windows library routines. To execute the linked compiled object code, the system user invokes the object code, causing the computer system to load the code in memory, from which the CPU reads and executes the code to perform the tasks identified in the program. Also stored in memory 352 are process parameters such as reactant gas flow rates and composition, temperatures and pressure necessary to carry out the deposition of an insitu boron doped amorphous or polycrystalline silicon film in accordance with the present invention.

Figure 3B:
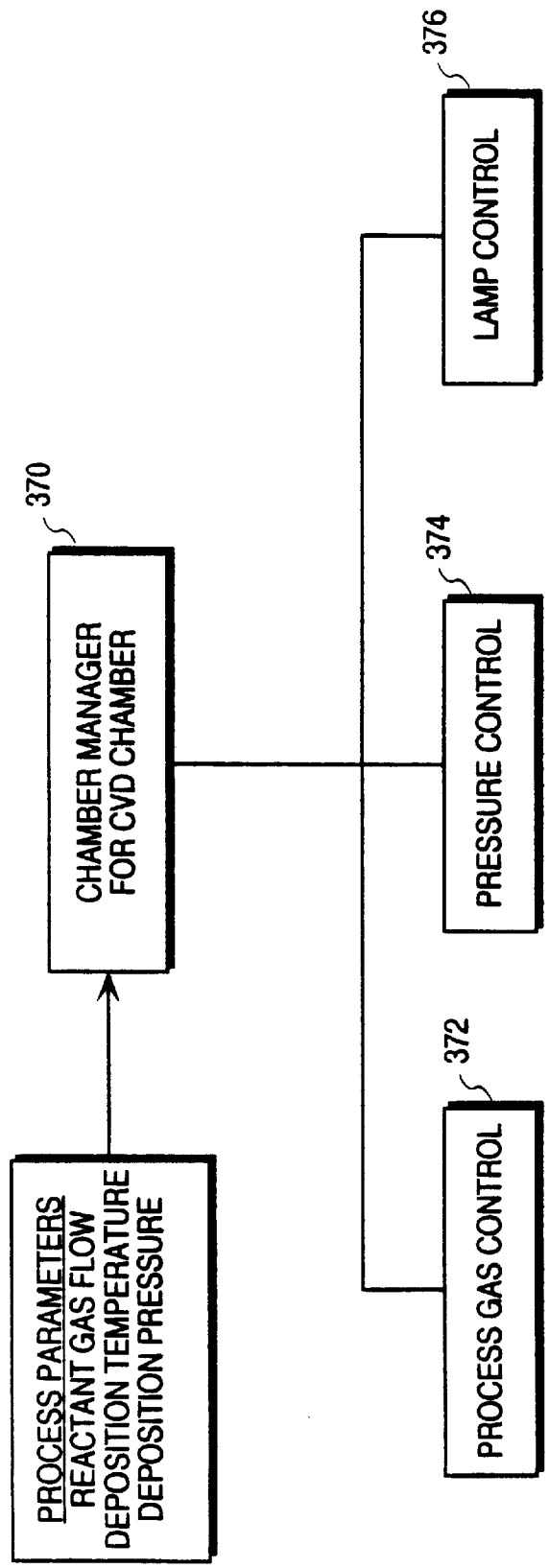
FIG. 3B is an illustration of a system control computer program which can be used to control the thermal chemical vapor deposition apparatus of FIG. 3A to form an insitu boron doped amorphous or polycrystalline silicon film.

FIG. 3B illustrates an example of the hierarchy of the system control computer program stored in memory 352. The system control program includes a chamber manager subroutine 370. The chamber manager subroutine 370 also controls execution of various chamber component subroutines which control operation of the chamber components necessary to carry out the selected process set. Examples of chamber component subroutines are reactant gas control subroutine 372, pressure control subroutine 374 and a lamp control subroutine 376. Those having ordinary skill in the art would readily recognize that other chamber control subroutines can be included depending on what processes are desired to be performed in the process chamber 319. In operation, the chamber manager subroutine 370 selectively schedules or calls the process component subroutines in accordance with the particular process set being executed. Typically, the chamber manager subroutine 370 includes steps of monitoring the various chamber components, determining which components needs to be operated based on the process parameters for the process set to be executed and causing execution of a chamber component subroutine responsive to the monitoring and determining steps.

The reactant gas control subroutine 372 has program code for controlling reactant gas composition and flow rates. The reactant gas control subroutine 372 controls the open/close position of the safety shut-off valves, and also ramps up/down the mass flow controllers 337 to obtain the desired gas flow rate. The reactant gas control subroutine 372 is invoked by the chamber manager subroutine 370, as are all chamber component subroutines and receives from the chamber manager subroutine process parameters related to the desired gas flow rates. Typically, the reactant gas control subroutine 372 operates by opening the gas supply lines, and repeatedly (i) reading the necessary mass flow controllers, (ii) comparing the readings to the desired flow rates received from the chamber manager subroutine 370, and (iii) adjusting the flow rates of the gas supply lines as necessary. Furthermore, the reactant gas control subroutine 372 includes steps for monitoring the gas flow rates for unsafe rates, and activating the safety shut-off valves when an unsafe condition is detected.

The pressure control subroutine 376 comprises program code for controlling the pressure in the chamber 319 by regulating the size of the opening of the throttle valve is set to control the chamber pressure to the desired level in relation to the total process gas flow, size of the process chamber, and pumping setpoint pressure for the exhaust system. When the pressure control subroutine 374 operates to measure the pressure in the chamber 319 by reading one or more conventional pressure nanometers connected to the chamber, compare the measure value(s) to the target pressure, obtain PID (proportional, integral, and differential) values from a stored pressure table corresponding to the target pressure, and adjust the throttle valve according to the PID values obtained from the pressure table. Alternatively, the pressure control subroutine 374 can be written to open or close the throttle valve to a particular opening size to regulate the chamber 319 to the desired pressure.

The lamp control subroutine 376 comprises program code for controlling the power provided to lamps 326 which is used to heat the substrate 100. The lamp control subroutine 376 is also invoked by the chamber manager subroutine 370 and receives a target, or setpoint, temperature parameter. The lamp control subroutine 376 measures the temperature by measuring voltage output of the temperature measurement devices directed at the susceptor 322 compares the measured temperature to the setpoint temperature, and increases or decreases power applied to the lamps to obtain the setpoint temperature.

Thus, a method and apparatus for depositing an insitu boron doped amorphous or polycrystalline film which reduces dome and liner coating has been described.

What is claimed is:

1. A substrate processing system comprising:

a substrate holder, located within a chamber, that holds a substrate during substrate processing;

a gas delivery system for introducing a reactant gas mix into said chamber to deposit a layer over said substrate;

a pump coupled to a gas outlet for controlling the chamber pressure;

a controller for controlling said gas delivery system and said pump;

a memory coupled to said controller comprising a computer-readable medium having a computer-readable program embodied therein for directing operation of said processing system, said computer-readable program comprising:

instructions for generating a deposition pressure within said chamber of between 10–50 torr and for heating said substrate to a temperature greater than or equal to 580° C. and for controlling said gas delivery system to introduce a reactant gas mix including a silicon source gas, a boron source gas and a carrier gas into said chamber to deposit a insitu boron doped silicon film over said substrate positioned on said substrate holder, said instructions introducing a said reactant gas into said chamber at a first rate and controlling said chamber pressure so that said reactant gas mix has a residence time of less than or equal to 3.0 seconds.

2. A substrate processing system comprising:

a substrate holder, located within a chamber, that holds a substrate during substrate processing;

a gas delivery system for introducing a reactant gas mix into said chamber to deposit a layer over said substrate;

a pump coupled to a gas outlet for controlling the chamber pressure;

a controller for controlling said gas delivery system and said pump;

a memory coupled to said controller comprising a computer-readable medium having a computer-readable program embodied therein for directing operation of said processing system, said computer-readable program comprising:

instructions for heating said substrate to a temperature greater than or equal to 580° C. and for controlling said gas delivery system to introduce a reactant gas mix including a silicon source gas, a boron source gas and a carrier gas into said chamber to deposit a insitu boron doped silicon film over said substrate positioned on said substrate holder, said instructions introducing a said reactant gas into said chamber at a first rate and controlling said chamber pressure so that said reactant gas mix has a velocity of at least 4 inches/sec.

3. A substrate processing system comprising:

a substrate holder, located within a chamber, that holds a substrate during substrate processing;

a gas delivery system for introducing a reactant gas mix into said chamber to deposit a layer over said substrate;

a pump coupled to a gas outlet for controlling the chamber pressure;

a controller for controlling said gas delivery system and said pump;

a memory coupled to said controller comprising a computer-readable medium having a computer-readable program embodied therein for directing operation of said chemical vapor deposition reactor system, said computer-readable program comprising:

instructions for heating said substrate to a temperature between 580° C.–750° C. and for controlling said gas delivery system to introduce a reactant gas mix including a silicon source gas, a boron source gas and a carrier gas into said vacuum chamber to deposit a insitu boron doped silicon film over said substrate positioned on said substrate holder, said instructions introducing said reactant gas mix into said chamber at a first rate and controlling said chamber pressure so that said reactant gas mix has a total pressure of less than 50 torr and a silicon source gas partial pressure of between 1–5 torr and diborane gas partial pressure of between 0.005–0.05 torr and a hydrogen carrier gas partial pressure between 9–48 torr in said vacuum chamber.

* * * * *